United States Patent [19]

Iwasaki

[11] Patent Number: 5,406,100
[45] Date of Patent: Apr. 11, 1995

[54] SEMICONDUCTOR INTEGRATED CIRCUIT DEVICE HAVING MULTI-CONTACT WIRING STRUCTURE

[75] Inventor: Tadashi Iwasaki, Tokyo, Japan

[73] Assignee: NEC Corporation, Tokyo, Japan

[21] Appl. No.: 958,784

[22] Filed: Oct. 9, 1992

[30] Foreign Application Priority Data

Oct. 9, 1991 [JP] Japan .................................. 3-261554

[51] Int. Cl.[6] ........................................... H01L 29/66
[52] U.S. Cl. .................................. 257/206; 257/369; 257/758; 257/389
[58] Field of Search ............... 257/204, 206, 758, 369, 257/389, 390, 391, 207

[56] References Cited

U.S. PATENT DOCUMENTS 5,124,778  6/1992  Adachi ................................ 257/369
5,182,621  1/1993  Hinooka .............................. 257/369

FOREIGN PATENT DOCUMENTS 337481A  10/1989  European Pat. Off. ........... 257/369
0123053   7/1985  Japan ................................. 257/369
0071260   4/1987  Japan ................................. 257/369
0305549  12/1988  Japan ................................. 257/369
0130554   5/1989  Japan ................................. 257/369

OTHER PUBLICATIONS

R. Eesley et al., "ACAP—A System for the Interactive Graphical Capture of Module Generators", IEEE 1991 Custom Integrated Circuits Conference, pp. 21.1.1–22.1.4, 1991.

Primary Examiner—William Mintel
Assistant Examiner—ALexander Oscar Williams
Attorney, Agent, or Firm—Sughrue, Mion, Zinn, Macpeak & Seas

[57] ABSTRACT

A semiconductor integrated circuit device comprises a complementary inverter implemented by a series combination of a p-channel enhancement type switching transistor and an n-channel enhancement type switching transistor, and a multi-level wiring structure coupled between the drain nodes of the two switching transistors and a capacitive load, wherein the multi-level wiring structure comprises a lower level wiring strip coupled at both ends thereof with the drain nodes through two sets of contact holes, and an upper level wiring strip coupled at both ends thereof with the lower level wiring strip through two contact holes so that both charge and discharge currents bi-directionally flow the upper and lower wiring strips, thereby enhancing the resistance against electro-migration.

1 Claim, 6 Drawing Sheets

SEMICONDUCTOR INTEGRATED CIRCUIT DEVICE HAVING MULTI-CONTACT WIRING STRUCTURE

FIELD OF THE INVENTION

This invention relates to a semiconductor integrated circuit device and, more particularly, to connections between a wiring structure and a circuit component incorporated in, for example, a semicustom-made integrated circuit device.

DESCRIPTION OF THE RELATED ART

A typical example of the semiconductor integrated circuit device is illustrated in Figs. I and 2. Although an inter-level insulating film structure is incorporated in the semiconductor integrated circuit device as described hereinbelow, the inter-level insulating film structure is deleted from FIG. I for the sake of better understanding. However, the locations of contact holes are indicated by small boxes.

A complementary inverter and a multiple level wiring structure are incorporated in the prior art semiconductor integrated circuit device, and the complementary inverter is fabricated on a p-type semiconductor substrate 1. The complementary inverter circuit is implemented by a series combination of a p-channel enhancement type switching transistor QP1 and an n-channel enhancement type switching transistor QN2, and the p-channel enhancement type switching transistor QP1 is separated from the n-channel enhancement type switching transistor QN2 by means of a thick field oxide film 2. The n-channel enhancement type field effect transistor QN2 comprises an n-type source region 1a formed in the p-type semiconductor substrate 1, an n-type drain region 1b also formed in the p-type semiconductor substrate 1, a thin gate oxide film (not shown) over a channel region between the n-type source and drain regions 1a and 1b, and a gate electrode 3a on the thin gate oxide film. On the other hand, an n-type well 1c is formed in the p-type semiconductor substrate 1 for the p-channel enhancement type field effect transistor QP1, and comprises a p-type source region 1d formed in the n-type well 1c, a p-type drain region 1e also formed in the n-type well 1c, a thin gate oxide film (not shown) over an channel region between the p-type source and drain regions 1d and 1e, and a gate electrode 3b on the thin gate oxide film. A conductive strip 3 provides the gate electrodes 3a and 3b, and a first inter-level insulating film 4a covers the conductive strip 3.

On the first inter-level insulating film 4a extend three conductive strips 5a, 5b and 5c which serve as a ground voltage line, an interconnection and a power voltage line, respectively. The ground voltage line is coupled with the source node of the n-channel enhancement type switching transistor QN2, and, accordingly, the conductive strip 5a is held in contact with the n-type source region 1a through a contact hole 6a formed in the first interlevel insulating film 4a. On the other hand, the power voltage line is coupled with the source node of the p-channel enhancement type switching transistor, and the conductive strip 5c is held in contact with the p-type source region 1d through a contact hole 6b formed in the first inter-level insulating film 4a. Two other contact holes 6c and 6d are further formed in the first inter-level insulating film 4a, and allow the conductive strip 5c to be held in contact with the n-type drain region 1b and the p-type drain region 1e. Thus, the p-channel enhancement type switching transistor QP1 and the n-channel enhancement type switching transistor QN2 are coupled in series between the power voltage line and the ground voltage line.

The conductive strips 5a, 5b and 5c are covered with a second inter-level insulating film 4b, and the first and second inter-level insulating films 4a and 4b as a whole constitute the inter-level insulating film structure 4. In the second inter-level insulating film 4b is formed a contact hole 6e which allows a conductive strip 7 to be held in contact with the conductive strip 5b. Since an input voltage signal IN is applied to the conductive strip 3 and, accordingly, to the gate electrodes 3a and 3b, the p-channel enhancement type switching transistor QP1 and the n-channel enhancement type switching transistor QN2 complementarily turn on and off, and either ground voltage or power voltage line is electrically connected with the conductive strip 5b which in turn relays the ground voltage level or the power voltage level to the conductive strip 7. Therefore, the conductive strips 5c and 7 serve as an output signal line OUT, and an output voltage level is applied from either ground voltage or power voltage line to the output signal line OUT. The output signal line OUT is coupled with a load capacitance C as shown in FIG. 3, and the load capacitance C is changed through the p-channel enhancement type switching transistor QP1 or discharged through the n-channel enhancement type switching transistor QN2 depending upon the input voltage signal IN.

A problem is encountered in the prior art semiconductor integrated circuit device in that the conductive strip 5b tends to be damaged rather than the conductive strip 7, and undesirable disconnection takes place within a relatively short time period.

The present inventor analyzed the aged deterioration of the conductive wiring 5c, and found that the disconnection took place due to electro-migration. In detail, the conductive strip 7 alternately charges and discharges the load capacitance, and the current bi-directionally flows therethrough. On the other hand, a part of the conductive strip 5c between the contact holes 6d to 6e only charges the current to the conductive strip 7, and the other part of the conductive strip 5c between the contact holes 6e and 6c only discharges the current from the conductive strip 7. Therefore, current selectively and unidirectionally flows the two halves of the conductive strip 5c. In general, uni-directional current easily conveys atoms of conductive substance, and direct current tends to damage a conductive strip rather than alternate current. Since the halves of the conductive strip 5c allows unidirectional current to selectively flow therethrough, the conductive strip 5c is damaged rather than the conductive strip 7 due to the electromigration. If the complementary inverter is expected to switch at high speed or to drive a large amount of capacitive load, the damage to the conductive strip 5c is serious.

Moreover, a lower conductive strip such as the conductive strip 5c is narrower than an upper conductive strip such as the conductive strip 7 as shown in FIG. 1, and the narrow conductive strip 5c further promotes the electro-migration because of high current density. If the conductive strip 5c is increased in width, the service life period may be prolonged. However, the wide conductive strips decrease the integration density.

SUMMARY OF THE INVENTION

It is therefore an important object of the present invention provide a semiconductor integrated circuit device which has a wiring structure less damaged without decrease of the integration density.

To accomplish the object, the present invention proposes to cause current to alternately flow over a wiring structure.

In accordance with the present invention, there is provided a semiconductor integrated circuit device fabricated on a single semiconductor chip, comprising: a) a switching means having a first node and second and third nodes respectively coupled with a charge line and a discharge line, and selectively coupling the aforesaid one of second and third nodes with the first node, first and second impurity regions different in conductivity type constituting the first node; b) a first inter-level insulating film covering the switching means, and having at least two first contact holes over first impurity region and at least two second contact holes over the second impurity region; c) a lower-level wiring pattern extending on the first inter-level insulating film, and held in contact with the first and second impurity regions through the at least two first contact holes and the at least two second contact holes, respectively; d ) a second inter-level insulating film covering the lower-level wiring pattern, and having at least two third contact holes over the lower-level wiring pattern; and e) an upper-level wiring pattern extending on the second inter-level insulating film, and held in contact with the lower-level wiring pattern through the at least two third contact holes.

BRIEF DESCRIPTION OF THE DRAWINGS

The feature and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
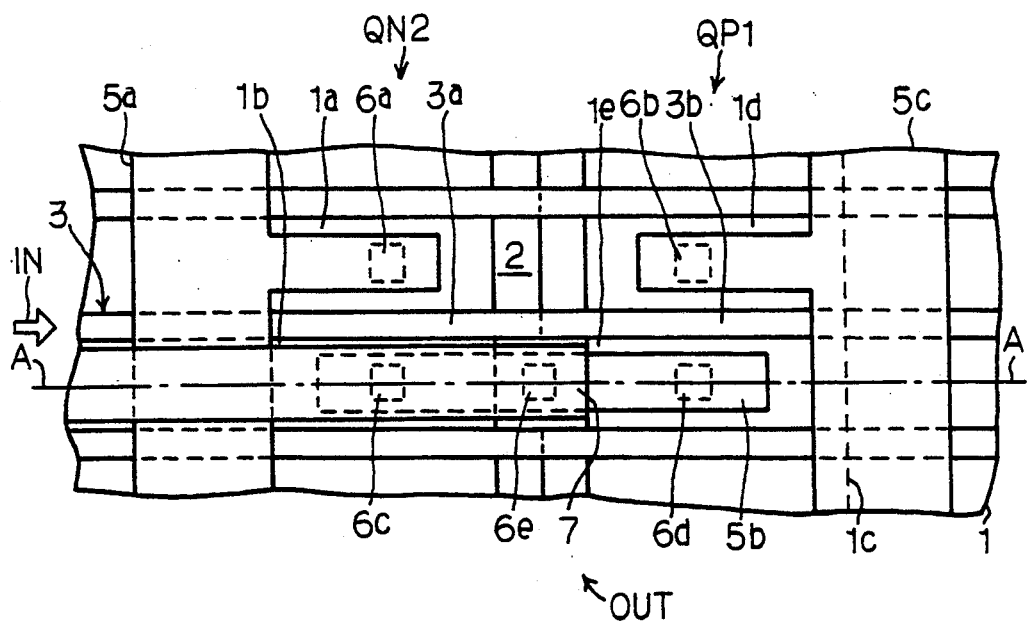
FIG. 1 is a plan view showing the layout of the prior art semiconductor integrated circuit device.
Figure 2:
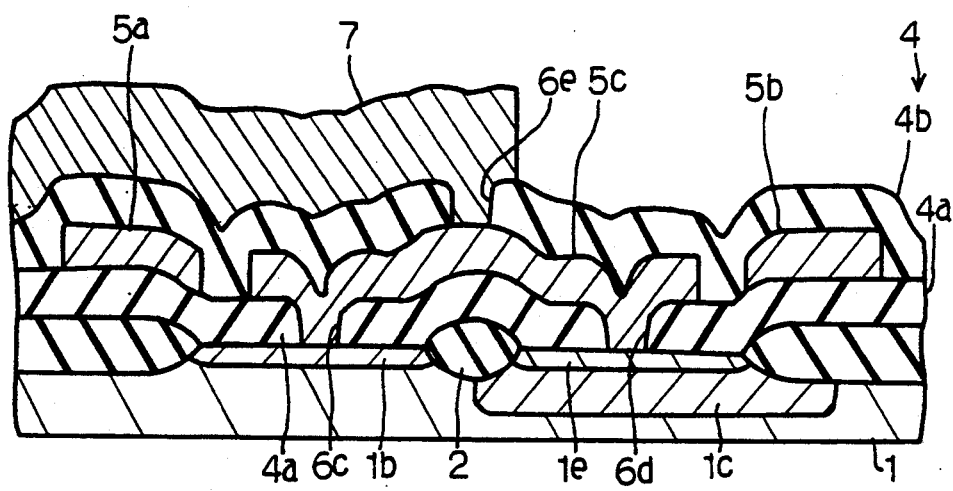
FIG. 2 is a cross sectional view taken along line A—A and showing the structure of the prior art semiconductor integrated circuit device.
Figure 3:
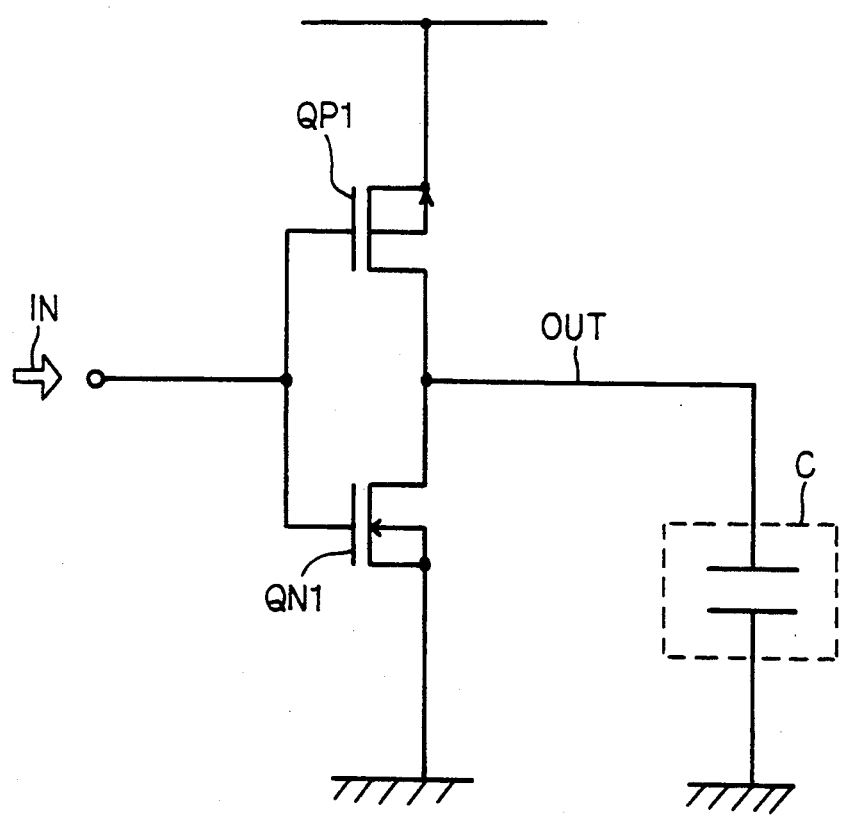
FIG. 3 is an equivalent circuit diagram showing the electrical connection of the prior art semiconductor integrated circuit device.
Figure 4:
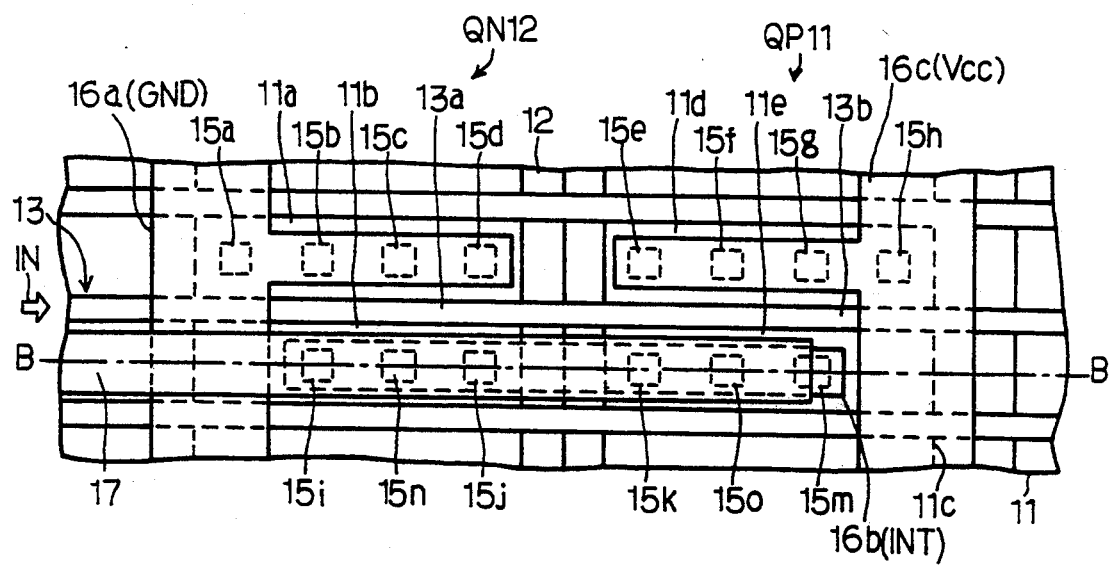
FIG. 4 is a plan view showing the layout of a semiconductor integrated circuit device according to the present invention.
Figure 5:
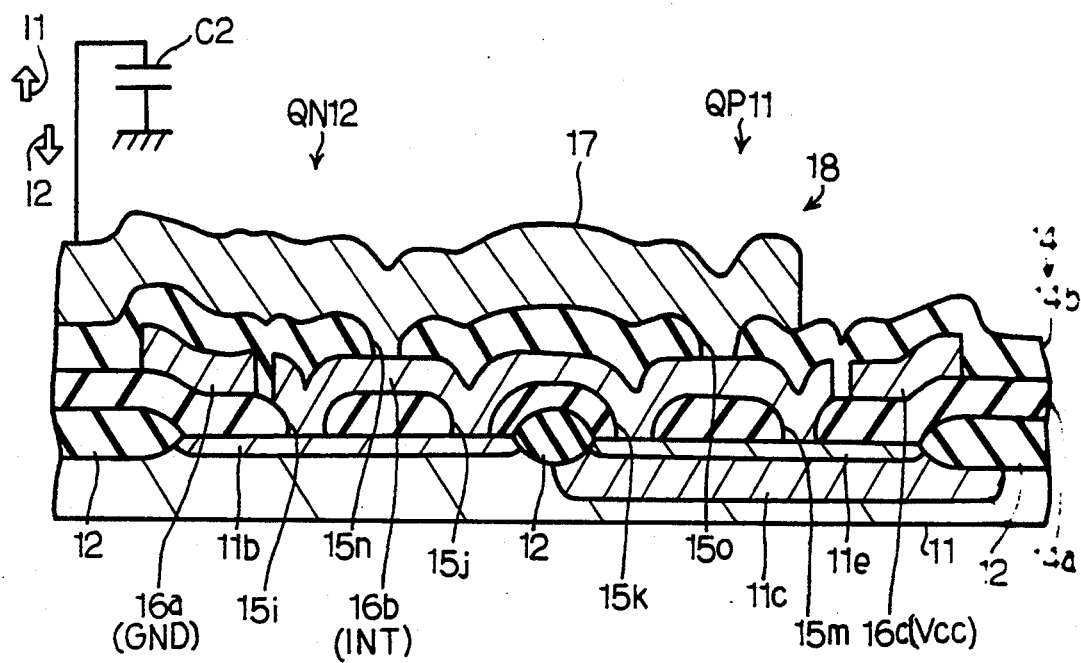
FIG. 5 is a cross sectional view taken along line B—B and showing the structure of the semiconductor integrated circuit device.

Referring to FIGS. 4 and 5, a semicustom-made semiconductor integrated circuit device embodying the present invention is fabricated on a p-type semiconductor substrate 11. Although an inter-level insulating film structure is provided for a multi-level wiring structure, the inter-level insulating film structure is not shown in FIG. 4 for better understanding of the gist of the present invention. However, contact holes formed in the inter-level insulating film structure are shown in FIG. 4, and small boxes stand for the locations of the contact holes.

A complementary inverter and the multi-level wiring structure are incorporated in the semiconductor integrated circuit device, and the complementary inverter is implemented by a series combination of a p-channel enhancement type switching transistor QP11 and an n-channel enhancement type switching transistor QN12, and a thick field oxide film 12 separates the p-channel enhancement type switching transistor QP11 from the n-channel enhancement type switching transistor QN12. The n-channel enhancement type field effect transistor QN12 comprises an n-type source region 11a formed in the p-type semiconductor substrate 11, an n-type drain region 11b also formed in the p-type semiconductor substrate 11, a thin gate oxide film (not shown) over an channel region between the n-type source and drain regions 11a and 11b, and a gate electrode 13a on the thin gate oxide film.

An n-type well 11c is formed in the p-type semiconductor substrate 11 for the p-channel enhancement type field effect transistor QP11, and comprises a p-type source region 11d formed in the n-type well 11c, a p-type drain region 11e also formed in the n-type well 11c, a thin gate oxide film (not shown) over an channel region between the p-type source and drain regions 11d and 11e, and a gate electrode 13b on the thin gate oxide film. A conductive strip 13 partially provides the gate electrodes 13a and 13b, and a first inter-level insulating film 14a covers the conductive strip 13 as well as the major surface of the p-type semiconductor substrate 11. Contact holes 15a, 15b, 15c, 15d, 15e, 15f, 15g, 15h, 15i, 15j, 15k and 15m are formed in the first inter-level insulating film 14a. The p-type semiconductor substrate 11 is grounded, and a power voltage level is supplied to the n-type well 11c. In this instance, the p-channel enhancement type switching transistor QP11 and the n-channel enhancement type switching transistor QN12 as a whole constitute a switching means, and the p-type source region 11d and the n-type source region 11a respectively serve as second and third nodes. Moreover, the p-type drain region 11e and the n-type drain region 11b respectively serve as first and second impurity regions which form in combination a first node, and the contact holes 15k and 15m and the contact holes 15i and 15j correspond to at least two first contact holes and at least two second contact holes, respectively.

On the first inter-level insulating film 14a extend three conductive strips 16a, 16b and 16c which serve as a ground voltage line GND, an interconnection INT and a power voltage line Vcc, respectively. The ground voltage line GND is coupled with the source node of the n-channel enhancement type switching transistor QN12, and, accordingly, the conductive strip 16a is held in contact with the n-type source region 11a through the contact holes 15a to 15d. On the other hand, the power voltage line Vcc is coupled with the source node of the p-channel enhancement type switching transistor QP11, and the conductive strip 16c is held in contact with the p-type source region 11d through the contact holes 15e to 15h. The contact holes 15i and 15j allow one end portion of the conductive strip 16c to be held in contact with the n-type drain region 11b, and the other end portion of the conductive strip 16b passes through the contact holes 15k and 15m so as to be in contact with the p-type drain region 11e. Thus, the p-channel enhancement type switching transistor QP11 and the n-channel enhancement type switching transistor QN12 are coupled in series between the power voltage line Vcc and the ground voltage line GND. The p-channel enhancement type switching transistor QP11 and the n-channel enhancement type switching transistor QN12 complementarily turns on and off depending upon an input voltage signal IN on the conductive strip 13, and selectively supply the ground voltage level and the power voltage level to the conductive strip 16b. In other words, the switching means selectively couples the second and third nodes with the first node for transferring one of the ground voltage level and the power voltage level Vcc to the first node.

Figure 6:
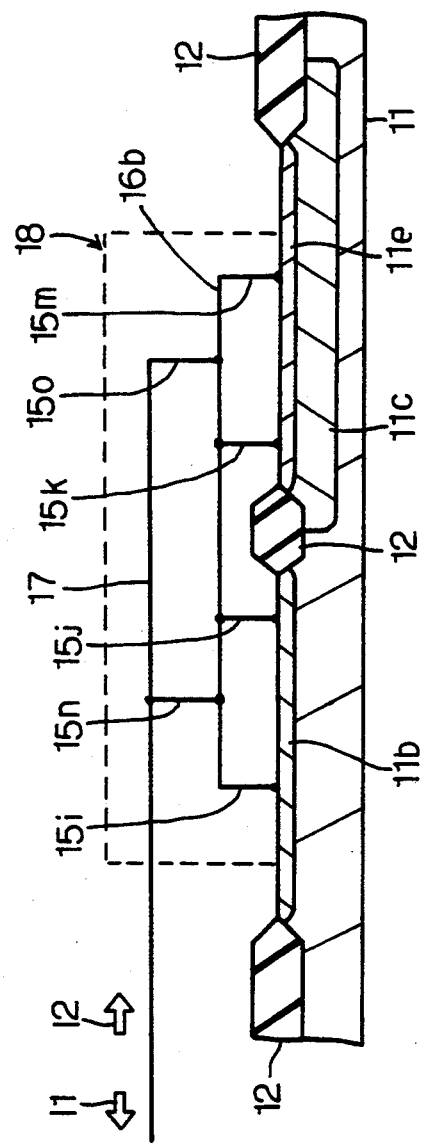
FIG. 6 is a view showing the electrically connection of the multi-level wiring structure incorporated in the semiconductor integrated circuit device shown in FIG. 4.

The conductive strips 16a, 16b and 16c are covered with a second inter-level insulating film 14b, and the first and second inter-level insulating films 14a and 14b as a whole constitute an inter-level insulating film structure 14. In the second inter-level insulating film 14b are formed contact holes 15n and 15o which allow a conductive strip 17 to be held in contact with the conductive strip 16b. The conductive strip 17 is coupled with a capacitive load C2, and charge current I1 and discharge current I2 flows into or from the capacitive load C2. The lower conductive strip 16b and the upper conductive strip 17 as a whole constitute a multi-level wiring structure 18 as will be better seen from FIG. 6.

The contact holes 15n and 15o are arranged to be located between the contact holes 15i and 15j and between the contact holes 15k and 15m, respectively, and the charge current I1 and discharge current I2 bi-directionally flows between the contact holes 15n and 15o and the contact holes 15i and 15j, or 15k and 15m through the intermediate portion of the conductive strip 16b. Thus, the charge current I1 and the discharge current I2 are split into two branch-currents through the contact holes 15n and 15o, and the current density on the conductive strip 16b is decreased to a half of the current density on the conductive strip 5c of the prior art. As a result, the conductive strip 16b is less damaged due to the electro-migration, and, accordingly, the service time period thereof is prolonged.

Second Embodiment

Figure 7:
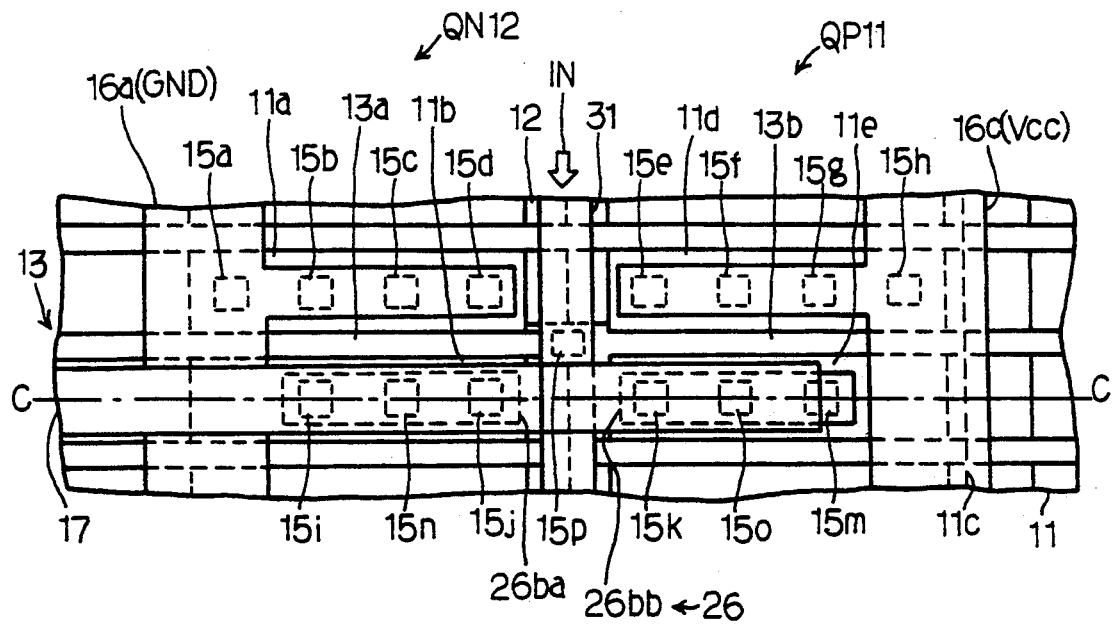
FIG. 7 is a plan view showing the layout of another semiconductor integrated circuit device according to the present invention.
Figure 8:
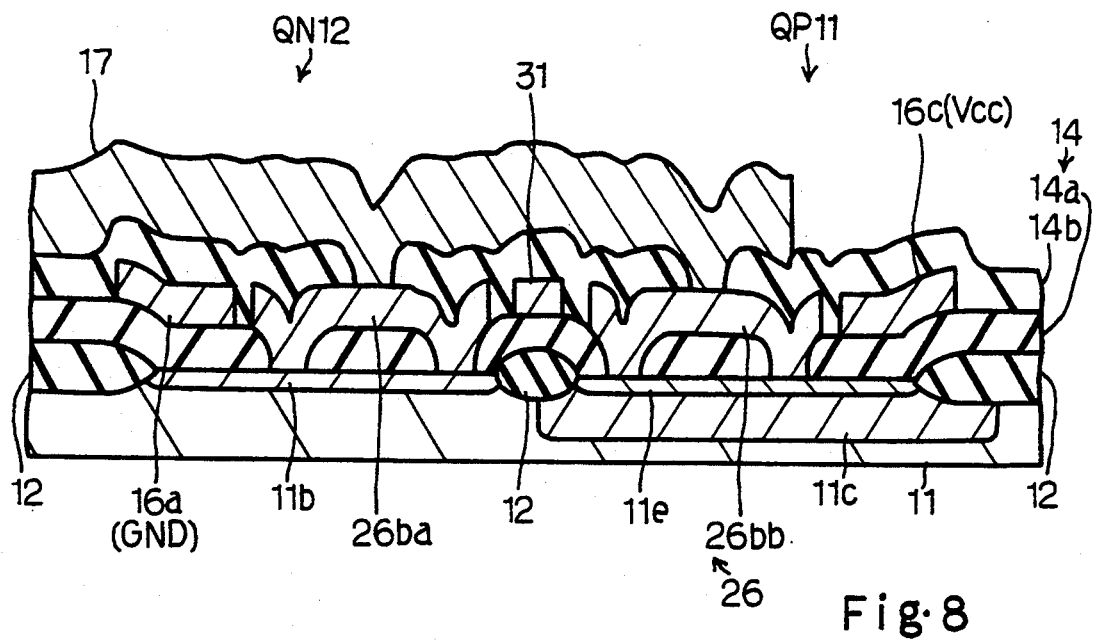
FIG. 8 is a cross sectional view taken along line C—C and showing the structure of the semiconductor integrated circuit device.

Turning to FIGS. 7 and 8 of the drawings, another semiconductor integrated circuit device embodying the present invention is illustrated. The semiconductor integrated circuit implementing the second embodiment is similar to the first embodiment except for a lower level conductive strip 26b split into two halves 26ba and 26bb. For this reason, the other regions, films and strips of the second embodiment are labeled with the same references designating the corresponding regions, films and strips of the first embodiment, and detailed description is omitted for the sake of simplicity.

Figure 9:
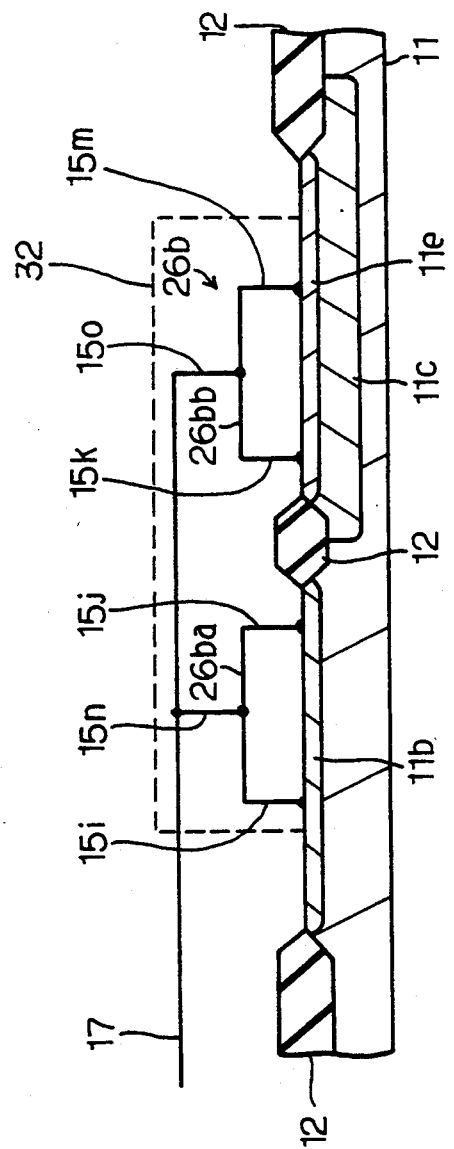
FIG. 9 is a view showing the electrically connection of the multi-level wiring structure incorporated in the semiconductor integrated circuit device shown in FIG. 7.

A conductive strip 31 further extends on the first inter-level insulating film 14a, and is held in contact with the conductive strip 13 through a contact hole 15p for supplying the input voltage signal IN to the gate electrodes 13a and 13b. Since the conductive strip 31 extends in perpendicular to the conductive strip 26, the conductive strip 26 is split into he two halves 26ba and 26bb, and allows the conductive strip 31 to pass therebetween. As a result, the two halves 26ba and 26bb are physically separated from each other, and are electrically connected through the conductive strip 17 as will be better seen from FIG. 9. In this instance, the two halves 26ba and 26bb and the conductive strip 17 as a whole constitute a multi-level wiring structure 32.

In general, the upper level conductive strip 17 is thicker than the lower level conductive strip 26 in view of smooth topography, and the service life period of the conductive strip 26b is less affected by the disconnection between the halves 26ba and 26bb.

As will be appreciated from the foregoing description, the first contact holes 15k and 15m, the second contact holes 15i and 15j and the third contact holes 15n and 15o effectively decrease the current density in the lower level wiring pattern, and allows current to bi-directionally flow. This results in that the service time period of the lower level wiring pattern is prolonged and is improved in resistance against the electro-migration.

Although particular embodiments of the present invention have been shown and described, it will be obvious to those skilled in the art that various changes and modifications may be made without departing from the spirit and scope of the present invention. For example, the contact holes between the impurity regions and the lower wiring strip may be increased.

What is claimed is:

1. A semiconductor integrated circuit device fabricated on a single semiconductor chip, comprising:
   a switching means having
   a) a first node, first and second impurity regions different in conductivity type selectively serving as said first node,
   b) a second node coupled with a charge line,
   c) a third node coupled with a discharge line,
   d) a first inter-level insulating film covering said first, second and third nodes, and having at least two first contact holes over said first impurity region and at least two second contact holes over said second impurity region,
   e) a lower-level wiring pattern extending on said first inter-level insulating film, and held in contact with said first and second impurity regions through said at least two first contact holes and said at least two second contact holes, respectively,
   f) a second inter-level insulating film covering said lower-level wiring pattern, and having at least two third contact holes over said lower-level wiring pattern, one of said at least two third contact holes being located over an intermediate position between said at least two first contact holes, the other of said at least two third contact holes being located over an intermediate portion between said at least two second contact holes, and
   g) an upper-level wiring pattern extending on said second inter-level insulating film, and held in contact with said lower-level wiring pattern through said at least two third contact holes, said switching means being responsive to an electric signal so as to selectively couple said first node with said second node and said third node, thereby charging and discharging said first node through said second node and said third node.

* * * * *